United States Patent
Hojati (12)

(10) Patent No.: US 6,594,804 B1
(45) Date of Patent: Jul. 15, 2003

(54) DETERMINING VERIFICATION COVERAGE USING CIRCUIT PROPERTIES

(75) Inventor: Ramin Hojati, Berkeley, CA (US)

(73) Assignee: Averant, Inc., Alameda, CA (US)

( * ) Notice: Subject to any disclaimer, the term of this patent is extended or adjusted under 35 U.S.C. 154(b) by 0 days.

(21) Appl. No.: 09/447,085

(22) Filed: Nov. 22, 1999

(51) Int. Cl.[7] .............................................. G06F 17/50

(52) U.S. Cl. ........................................................ 716/5

(58) Field of Search .............................. 716/2, 5, 6, 8, 716/17

(56) References Cited

U.S. PATENT DOCUMENTS

| | | | | |
|---|---|---|---|---|
| 5,452,239 A | * | 9/1995 | Dai et al. ...................... | 716/17 |
| 5,528,508 A | * | 6/1996 | Russell et al. ................. | 716/8 |

OTHER PUBLICATIONS

Affirma FormalCheck model checker, Cadence Design Systems, Inc., Apr. 1999.
*Coverage Estimation for Symbolic Model Checking*, Y. Hoskote, T. Kam, P. Ho and X. Zhao, Proceeding of the 36th Design Automation Conference, New Orleans, Louisiana, Jun. 21, 1999.

* cited by examiner

*Primary Examiner*—Matthew Smith
*Assistant Examiner*—Thuan Do
(74) *Attorney, Agent, or Firm*—Vierra Magen Marcus Harmon & DeNiro LLP

(57) ABSTRACT

A system is disclosed to provide static coverage analysis. The system receives at least two inputs including a hardware description and a set of properties. Using the methods of the present invention, the system determines what portions of the design can be verified using the set of properties. In one embodiment, the invention includes three levels of analysis. Each level provides a different tradeoff between level of accuracy and speed.

30 Claims, 7 Drawing Sheets

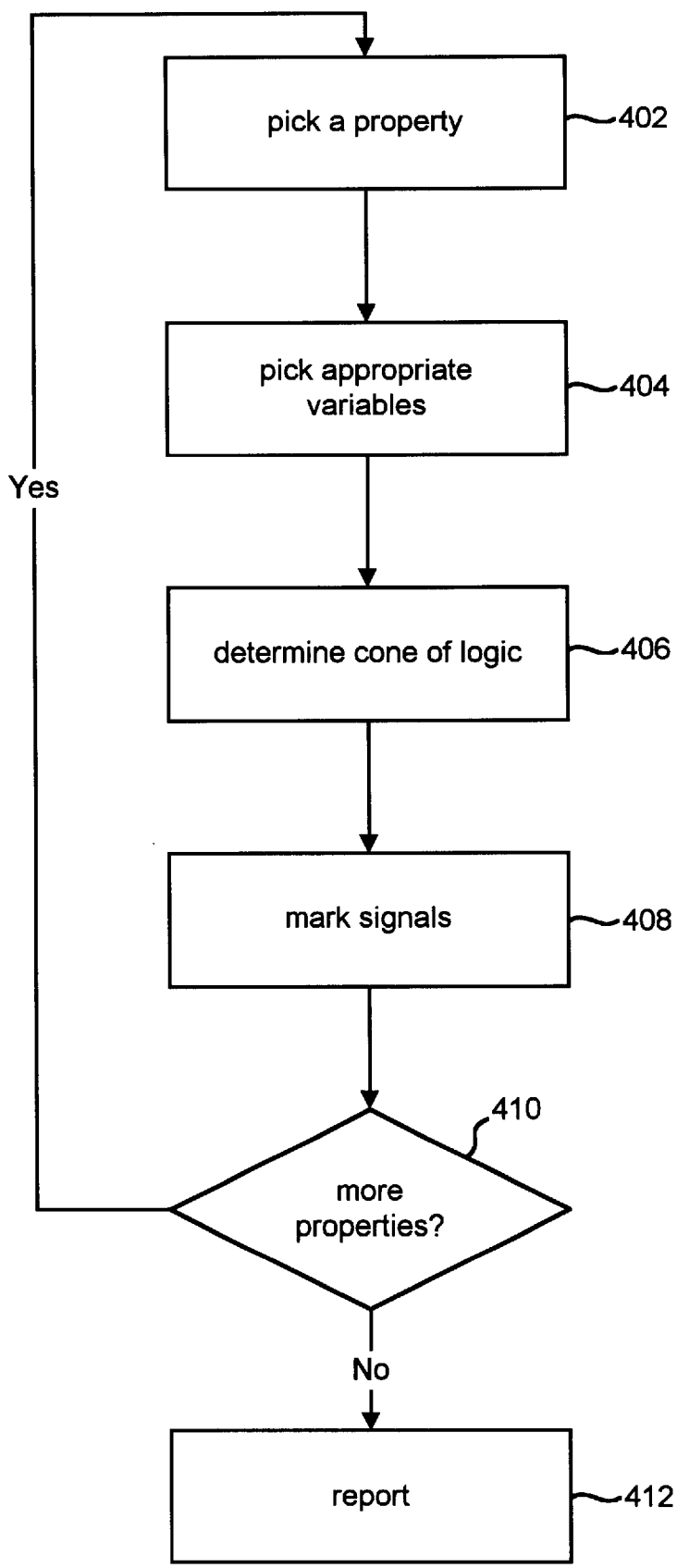

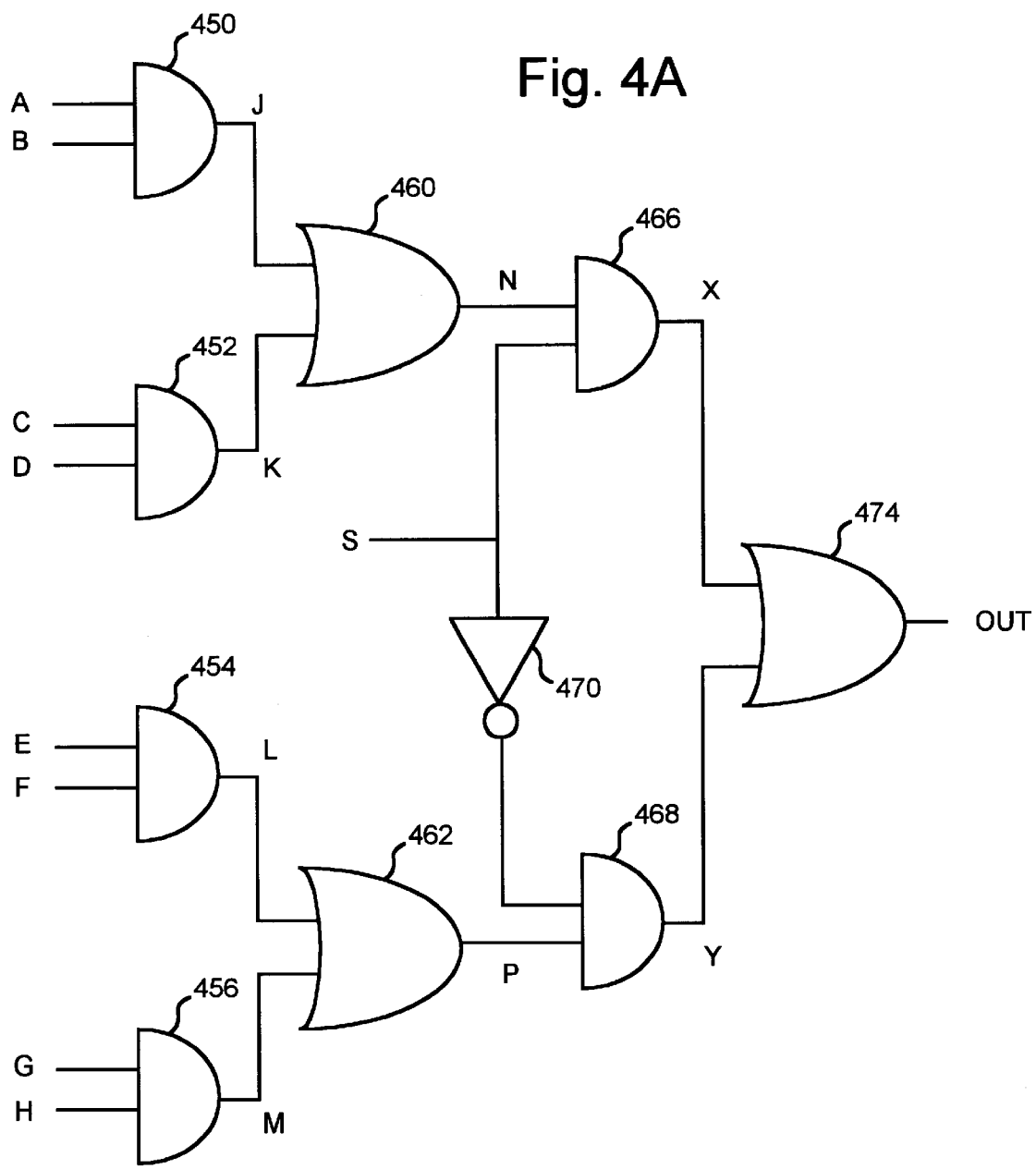

DETERMINING VERIFICATION COVERAGE USING CIRCUIT PROPERTIES

BACKGROUND OF THE INVENTION

1. Field of the Invention

The present invention is directed to system for determining the extent that a design has been or can be verified.

2. Description of the Related Art

As circuit designs become more complex, the cost of manufacturing increases and the time-to-market becomes even more critical, it has become apparent that circuit designers must verify their designs prior to manufacturing. That is, after a given circuit is designed, the circuit designer will perform tests or simulations using a computer to verify that the circuit design will operate as intended. For example, a circuit designer may use a schematic capture program to draw a circuit or may use a hardware description language to describe a circuit. The circuit designer will then create tests in order to simulate operation of the circuit.

Even if a design passes the tests created by the designer, it does not mean that the circuit will operate as intended. There may be various modes of behavior which are not verified by the designer's tests. Therefore, there is a need to know whether the tests provided by the designer are exhaustive. That is, the designer needs to know if some portion of the design has not been tested.

One previous attempt to verify designs and determine the amount of verification has included writing test vectors. Test vectors are sets of inputs to a circuit which are used by a simulator to simulate the operation of the circuit. A designer must write the test vector manually or use software to create the test vectors. It typically takes a long time to write a sufficient set of test vectors and rarely do these test vectors provide one hundred percent coverage. Another drawback of using test vectors is that the time needed to run the simulation using the test vectors can be extremely long, even to the point where the design process becomes unreasonably stalled. If the simulation using test vectors reveals that additional vectors are needed, the designer must then create additional test vectors which takes even more time and run the entire simulation again. Because time to market is critical and engineering resources are expensive, the prior solution for providing verification of a design is not sufficient.

SUMMARY OF THE INVENTION

The present invention, roughly described, includes a system for providing static coverage analysis. The system receives at least two inputs including a hardware description and a set of properties. The system determines what portions of the design can and cannot be verified using the set of properties. In one embodiment, the invention includes three levels of analysis. Each level provides a different tradeoff between accuracy and speed.

One embodiment of the present invention is based on signal coverage. A signal is uncovered if a change in the gate driving the signal does not change the outcome of verification. An input variable, which by definition is not the output of any gate, is considered uncovered if tying it down to a constant value (e.g. zero or one) does not change the outcome of verification.

One embodiment of the present invention provides for incremental analysis. That is, subsequent iterations of the process can be refined to only look at the new properties and/or those portions of the design that were not previously covered by the existing properties. The present invention provides a static analysis, which means that test vectors are not used to simulate over time. Because the invention uses a static analysis, run time is significantly shorter than using test vectors.

In one embodiment, the present invention includes a method for determining verification coverage of a set of properties. The method includes the steps of reading a set of properties, reading a design and determining what portions of the design can be verified by the set of properties without using test vectors. In one embodiment, the step of determining includes the steps of choosing a property, choosing one or more appropriate variables in the property, determining fan-in for the chosen one or more appropriate variables and marking the signals in the determined fan-in as being covered. In another embodiment, the step of determining includes the steps of propagating constants for a given property, removing constants from the property, choosing one or more appropriate variables in the property, determining fan-in for one or more chosen appropriate variables and marking the signals in the determined fan-in as being covered. In yet another embodiment, the step of determining may also include the steps of propagating constants for a property, making signals as being partially covered, removing constants from the property, determining a cone of logic for the property, choosing a signal and an uncovered fault, verifying the design using the set of properties and the first signal at the uncovered fault, reporting the first signal if no properties failed, and repeating the process for other signals and uncovered faults.

The present invention can be implemented using software, hardware, or a combination of software and hardware. When all or portions of the present invention are implemented in software, that software can reside on a processor readable storage medium. Examples of an appropriate processor readable storage medium include a floppy disk, hard disk, CD-ROM, memory IC, etc. The hardware used to implement the present invention includes an output device (e.g. a monitor or printer), an input device (e.g. a keyboard, pointing device, etc.), a processor in communication with the output device and processor readable storage medium in communication with the processor. The processor readable storage medium stores code capable of programming the processor to perform the steps to implement the present invention. In one embodiment, the processor reads the properties and the design from the processor readable storage medium. The process of the present invention can also be implemented on a web page on the Internet or on a server that can be accessed over communication lines.

These and other objects and advantages of the invention will appear more clearly from the following detailed description in which the preferred embodiment of the invention has been set forth in conjunction with the drawings.

BRIEF DESCRIPTION OF THE DRAWINGS

FIG. 4 is a flow chart describing one embodiment of the first level of analysis for the present invention.

FIG. 4A is a schematic of an exemplar circuit used to explain the steps of FIG. 4.

DETAILED DESCRIPTION

Figure 1:
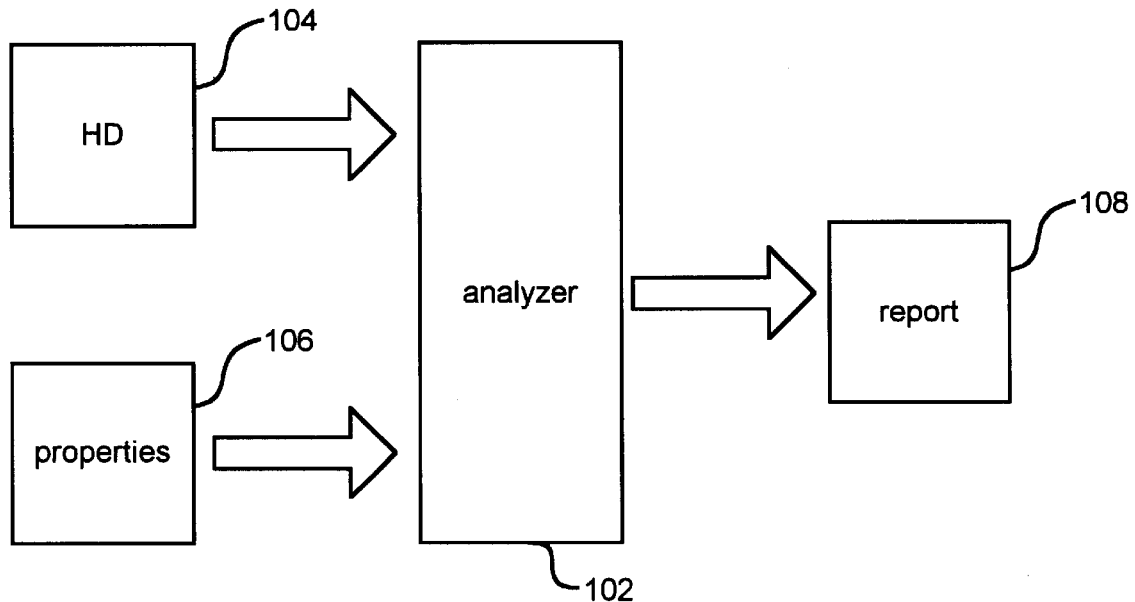
FIG. 1 is block diagram explaining the present invention.

FIG. 1 is a block diagram explaining the components of the present invention. Analyzer 102 provides static coverage analysis according to the present invention. Analyzer 102 receives two inputs, including hardware description (HD) 104 and properties 106. In one embodiment, HD 104 comprises one or more files stored on a computer readable storage medium which includes a description of the design. In one alternative, the design is a circuit design and HD 104 is a description of that circuit design in a hardware description language known in the art. One example of a suitable hardware description language is the Verilog hardware description language.

Properties 106 includes one or more files on a computer readable storage medium that include a list of statements, where each statement is either a definition or an assertion. Assertions are independent of each other, whereas a definition can be in terms of other definitions.

Properties ::=
   One or more <statement>
<statement> ::=
   <definition>|<assertion>
<definition> ::=
   #define <name> (<arguments>) {<formula>}
where <name> is the name of the function, <arguments> is a comma-separated list of identifiers, and the body of the definition is a <formula>. A definition represents a parameterized formula (or macro) and does not become active unless used in an assertion with actual parameters. A definition typically precedes the assertions that use it.

An assertion is a formula ended by a semicolon.
<assertion> ::=
   <formula> ;|
   fail <formula>;
The fail construct can be used to verify that a property which the user expects to fail indeed fails. A <formula> can be built recursively from other <formula>s and operators. A formula is defined as follows:
<formula> ::=
   <formula> <binary_operator> <formula>|
   <reduction_operator> <formula>|
   onehot (',' separated list of <formula>)|
   onehot0 (',' separated list of <formula>)|
   onecold (',' separated list of <formula>)|
   onecold1 (',' separated list of <formula>)|
   (<formula>)|
   'X(<formula>)|
   <concatenated_identifiers>|
   <identifier>|
   <constant>|
   <macro_instantiation>
<binary_operator> ::=
   <boolean_operator>|
   <bitwise_operator>|
   <arithmetic_operator>|
   <relational_operator>|
   <shift_operator>

A <boolean_operator> is any of the following: not (!), and (&&), or (||), imply (=>), xor (^).

A <bitwise_operator> is any of the following: negation (~), and (&), or (|), xor (^), xnor (~^ or ^~).

An <arithmetic_operator> is any of the following: add (+), multiply (*), subtract (−).

A <relational_operator> is any of the following: less-than (<), less-than-or-equal (<=), greater-than (>), greater-than-or-equal (>=), equal (==), not-equal (!=).

A <shift_operator> is any of the following: logical-shift left (<<), logical-shift right (>>), rotate right (ror), rotate left (rol), and arithmetic shift right (sra). The right operand must be an integer.

A <reduction_operator> applies the operator to all the bits of its only operand. A <reduction_operator> is any of the following: or (|), and (&), xor (^), nor (~|), nand (~&), xnor (~^). The onehot operator returns true if and only if its operands are onehot under all conditions, e.g. onehot (x[0], y[2:0]). The onehot0 operator is similar to the onehot operator except it also returns true if all bits of its operand are zero. The onecold operator returns true if and only if its operands are onecold (only one bit is zero) under all conditions. Similarly, onecold1 returns true if its operands are all one or onecold. The 'X operator means the value of the operand at the next clock cycle. <concatenated_identifiers> is a comma-separated list of identifiers enclosed in braces { }. An <identifier> can be ports or intermediate signals. A <constant> can be either an integer or bit (binary, octal, and hexadecimal). The syntax is the same as the Verilog language. A few examples follow:

2'b10 (2-bit binary "10")
   4'b11_01 (4-bit binary "1101")
   3'o23_3 (3-digit octal "233")
   2'hA1 (2-digit hex "A1")

Note that an integer constant is equivalent to a 31-bit binary constant with the same value. The following example asserts that if op1 is 1 then mult and op2 should be the same: (op1==1)=>(mult==op2).

Analyzer 102 measures coverage for the properties identified in properties 106. That is, analyzer 102 answers the question "has the designer written enough properties to completely verify the entire design?" Coverage measuring helps keep track of what portions of the design have been or can be verified and what remains to be verified. After analyzer 102 determines how much of the design described by HD 104 is verified by properties 106, analyzer 102 reports the uncovered signals in one or more files shown in FIG. 1 as report 108. If a report already exists, the user can instruct analyzer 102 to assume the signals of the design not in the report as being covered. In other words, a report can be used to allow the user to measure coverage of a selected set of signals. As an example, assume that the user has measured the coverage of ten properties described and realizes that five signals are uncovered. The user may then write three more properties and measure the coverage that is achieved by the three new properties. Alternately, the user can instruct analyzer 102 to only check to see if the new set of properties will verify the uncovered variables listed in report 108. In one embodiment, report 108 consist of up to three sections: (1) uncovered signals, (2) stuck-at-one uncovered signals and (3) stuck-at-zero uncovered signals.

Analyzer 102 can perform any one of three levels of analysis so users can make faster progress in verifying a design than with a single level approach. Level 1 is extremely fast. Level 2 is more accurate than Level 1, but slower than level 1. Level 3 is more accurate than levels 1 and 2, and is performed slower than levels 1 and 2. One embodiment of the present invention can perform all three levels. Other embodiments of the present invention will only perform one of the levels or two of the levels.

Figure 2:
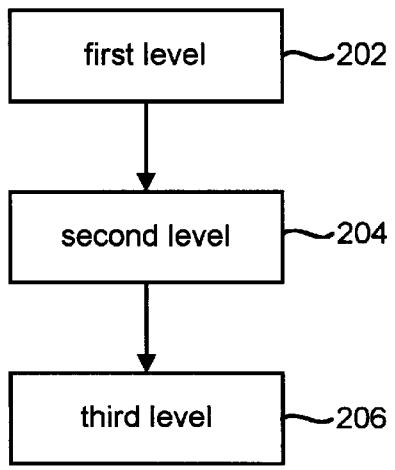
FIG. 2 is flow chart depicting the three levels of the present invention.

FIG. 2 is a flow chart describing how the three levels of analysis are used. In one embodiment, designers first work with the first level 202 until the design is completely covered (or another suitable stopping point) and then move on to the second level 204 to uncover subtler conditions. When the design is completely covered at the second level 204, the process is repeated again at third level 206.

Figure 3:
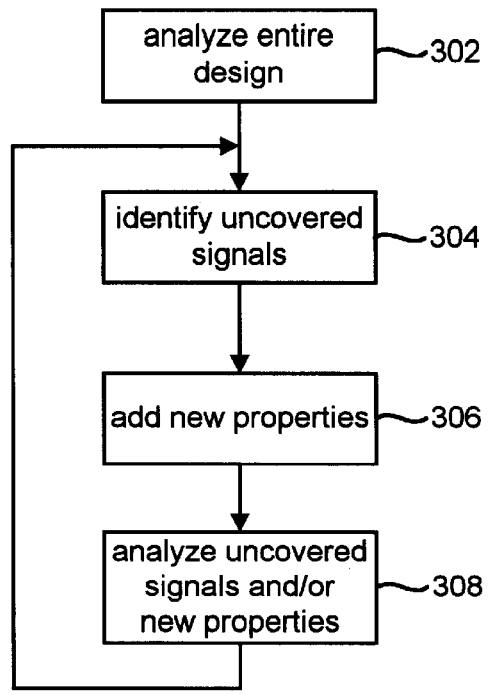
FIG. 3 is a flow chart illustrating one embodiment of a method for implementing one level of the present invention.

FIG. 3 is a flow chart which explains the operation at any one of the levels of operation shown in FIG. 2. In step 302, the entire design is analyzed by analyzer 102. That is, all the properties 106 are checked against HD 104 to determine what portions of the design have been or can be verified by properties 106. In one embodiment, step 302 includes considering all properties described in properties 106 and all appropriate portions of a design described by HD 104. For purposes of this invention, the phrase determining what portions of the design can be verified by a set of properties means the same thing as determining what portions of the design are not verified by the properties. That is, determining what portions of the design are verified is the same thing as determining what portions are not verified. In step 304, analyzer 102 identifies the uncovered signals by creating report 108. Step 304 can also include appending information to an existing report. Report 108 can include one or more files saved on a computer readable storage medium, printing the results, displaying the results on the monitor, using speech synthesis to audibly report the results, etc. After a user of analyzer 102 reviews report 108, the user will see which signals are not covered by properties 106. The user will then likely create new properties to verify the uncovered signals. In step 306, these new properties are added to properties 106. In step 308, analyzer 102 will analyze HD 104 in light of properties 106 (with the additions from step 306). In one embodiment of step 308, analyzer 308 will only check for incremental coverage. One example of checking for incremental coverage includes only checking whether the signals identified in report 108 are covered by the current set of properties. In another embodiment, incremental coverage includes checking all signals in HD 104 against only the new properties added in step 306. In yet another embodiment, step 308 could include analyzing only the uncovered signals in report 108 against the new properties. After step 308, the method loops back to step 304 and the uncovered signals are identified. At any time, the user can stop the process.

FIG. 4 is a flow chart describing the step of analyzing a design at the first level. In step 402, analyzer 102 picks a property from properties 106 which has not already been considered. In step 404, analyzer 102 chooses all of the appropriate variables described in the property. In one embodiment, the appropriate variables are those variables which are not in a transitive fan-in of any other variables in the property. The transitive fan-in is determined by tracing a signal backwards and seeing all signals that lead into the signal in question directly or through logic. This creates a cone of logic for a signal. In one embodiment, a subtree in a cone of logic is eliminated from the cone of logic if no signal in the subtree fans out to a gate of some other subtree. In step 406, analyzer 102 determines the cone of logic for a property. The cone of logic for a property includes the aggregate of the cones of logic for each signal or variable identified in step 404. Although it is called the cone of logic, it may actually be multiple cones. The cone of logic will include previous inputs to registers and signals back in time until the signals are not relevant or the circuit ends. In step 408, analyzer 102 marks all signals in the cone of logic for the property under consideration. Each of the signals are marked as being covered. In step 410, analyzer 102 determines whether there are any more properties to consider. If there are more properties, the method loops back to step 402. Otherwise, in step 412, analyzer 102 reports the results of the analysis to the user. In one embodiment, step 402 includes reporting all signals that were marked as covered. In another alternative, step 412 includes reporting all signals that are uncovered. The uncovered signals are the signals that were not marked as being covered.

FIG. 4A is a schematic of an example circuit that includes six AND gates, 450, 452, 454, 456, 466 and 468, as well as three OR gates 460, 462 and 474. The circuit will be used to explain the steps of FIG. 4. AND gate 450 has two inputs A and B. AND gate 452 has two inputs C and D. The output of AND gate 450 and the output of AND gate 452 are inputs to OR gate 460. AND gate 454 has two inputs E and F. AND gate 456 has two inputs G and H. The output of AND gate 454 and the output of AND gate 456 are inputs to OR gate 462. The inputs to AND gate 466 include the output of OR gate 460 (signal N) and the signal S. The inputs to AND gate 468 includes the output from OR gate 462 (signal P) and the output from inverter 470. The input to inverter 470 is the signal S. The output of AND gate 466 (signal X) and the output of AND gate 468 (signal Y) are inputs to OR gate 474. The output signal of OR gate 474 is labeled as OUT.

As described above, step 406 of FIG. 4 includes determining the transitive fan-in for a particular signal in a circuit. For exemplar purposes, assume that the system is determining the transitive fan-in for signal X of FIG. 4A. The system traces backwards in the circuit starting at signal X. Thus, the transitive fan-in would include the inputs to AND gate 466 and trace the input signals backwards to the beginning of the circuit. Thus, the transitive fan-in for signal X would include the signals S, N, J, K, A, B, C and D. To optimize performance, one embodiment contemplates that the transitive fan-in only includes signals that are relevant to the property. In that embodiment, the transitive fan-in for signal X may include only N and S because the other signals are not relevant.

To explain the process of choosing appropriate variables in step 404 of FIG. 4, assume that there is a property in properties 106 which states the following:

!S=>X==0

If this is the property under consideration in steps 404–408, then in step 404 analyzer 102 would pick one of the appropriate variables, either S or X. In this case, analyzer 102 will not pick signal S because S is in the transitive fan-in of signal X. Thus, in step 404 analyzer 102 would pick variable X and compute its fan-in as described above. In step 408, all the signals in the fan-in for X would be marked as covered. If there was only one property (!S=>X==0) in properties 106, then in one embodiment, report 108 would indicate that signals A, B, C, D, E, F, G, H, J, K, L M, P, Y and OUT are not covered.

Figure 5:
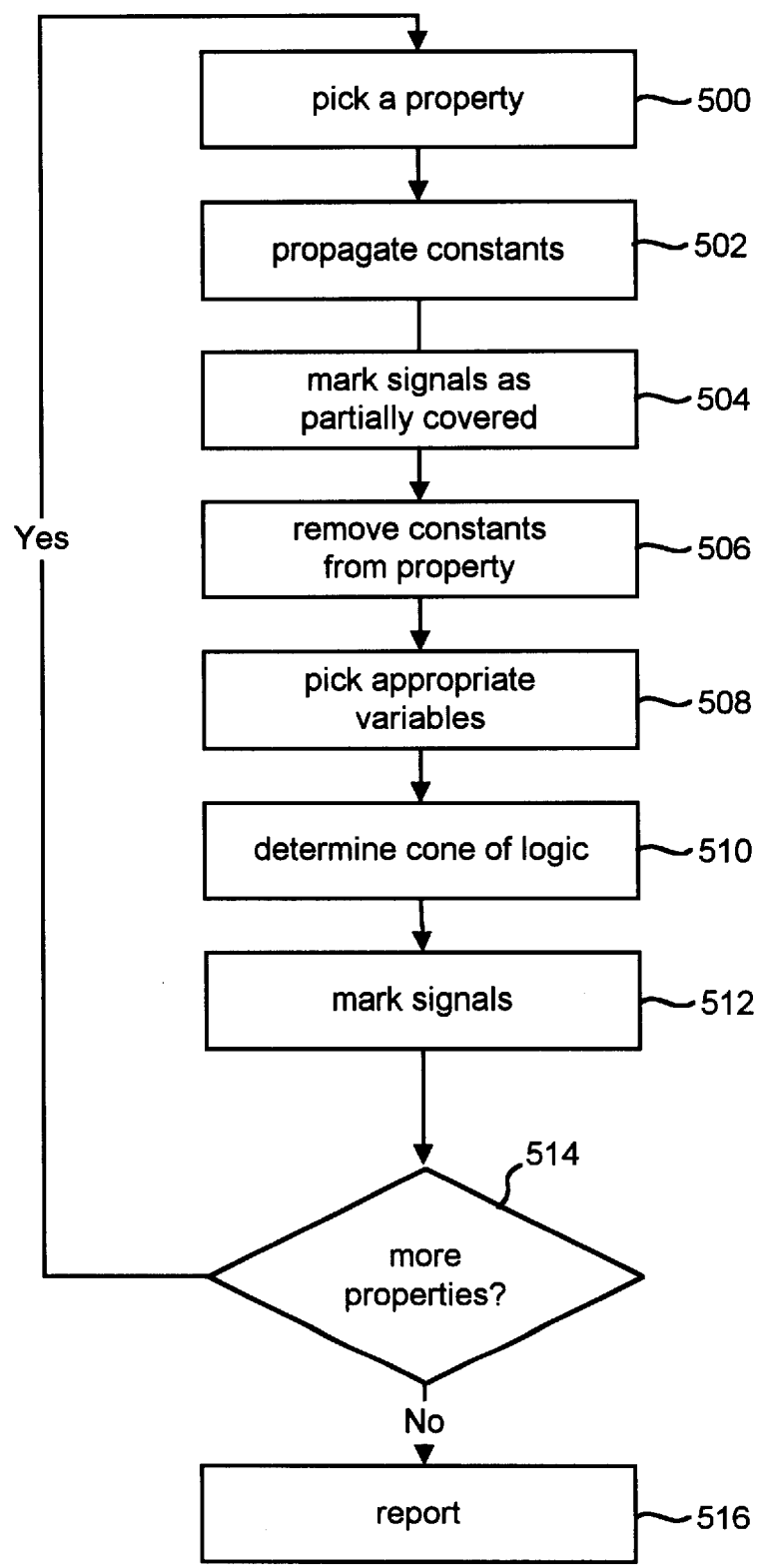
FIG. 5 is a flow chart describing one embodiment of the second level of analysis for the present invention.

FIG. 5 is a flow chart describing one embodiment of the second level of analysis of the present invention. In step 500, analyzer 102 picks a property. In step 502, analyzer 102 identifies all the constants in the property and propagates those constants throughout the circuit. In step 504, all of the signals in the design that were affected by propagating the constant are marked as being partially covered, indicating whether they are at zero or one. In step 506, analyzer 102 rewrites the properties to remove the constants. In step 508, analyzer 102 picks appropriate variables. Step 508 is analogous to step 404 of FIG. 4. In step 510, analyzer 102 determines the cone of logic for the property under consideration. Step 510 is similar to step 406 of FIG. 4. In step 512, analyzer 102 marks all the signals within the cone of logic. Step 512 is analogous to step 408 of FIG. 4. In step 514, analyzer 102 determines whether there are more properties to consider. If there are, the method loops back to step 500. Otherwise, the method loops to step 516. In step 516, analyzer 106 reports the results of the method of FIG. 5. In one embodiment of step 516, the report would indicate the signals that were not covered (a signal not marked as covered) and signals that are partially covered.

Figure 6:
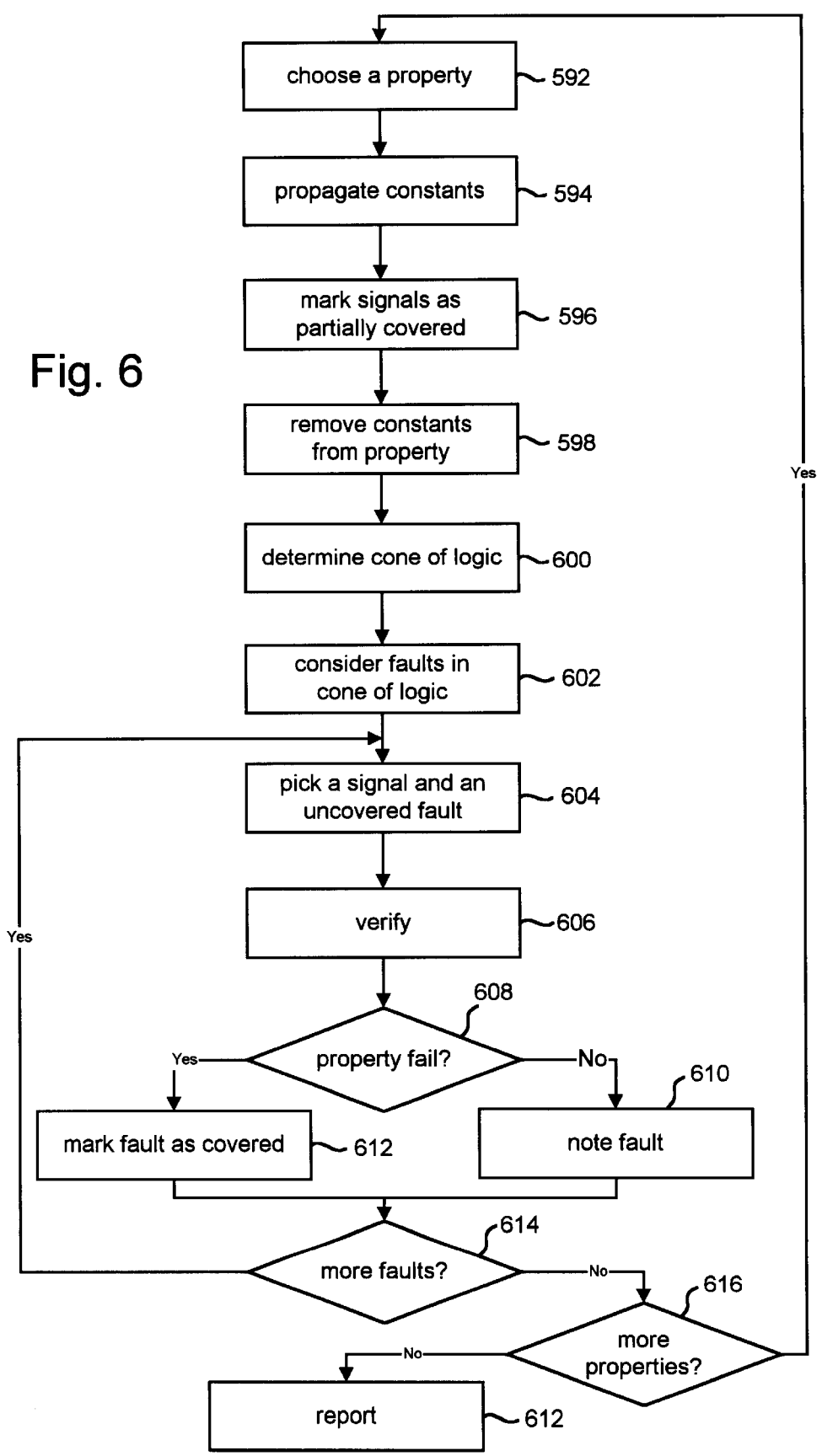
FIG. 6 is a flow chart describing one embodiment of the third level of analysis for the present invention.

FIG. 6 is a flow chart describing one embodiment of the third level of analysis of the present invention. In step 592, analyzer 102 chooses one of the properties from properties 106 that has not already been considered by the method of FIG. 6. In step 594, analyzer 102 identifies all the constants in the current property under consideration and propagates those constants throughout the circuit. In step 596, all of the signals in the design that were affected by propagating the constants are marked as being partially covered, indicating whether they are at zero or one. In step 598, analyzer 102 rewrites the properties to remove the constants. In step 600, analyzer 102 determines the cone of logic for the current property under consideration. In step 602, analyzer 102 considers or identifies all the faults within the cone of logic determined in step 600.

In step 604, analyzer 102 picks a signal and one of the uncovered faults for that signal that was identified in step 602. The signal and fault chosen in step 604 are within the cone of logic for the current property under consideration. Step 604 includes altering the design (e.g. HD 104) so that the signal is always at the uncovered fault. That is, analyzer 102 sticks the signal at logic one or logic zero depending on the fault. In step 606, analyzer 102 will verify the behavior of HD 104 (with the alteration) using properties 106. In step 608, analyzer 102 will determine whether any of the properties failed. If no properties fail, then in step 610 analyzer 102 will note that the fault under consideration cannot be verified by the current set of properties 106. If at least one property does fail, then in step 612, the fault is marked as being covered. After both step 610 and step 612, analyzer 102 determines whether there are any more faults to consider for the current property in step 614. If there are more faults to consider for the current property, then the method loops back to step 604. If there are no more faults to consider for the current property, then analyzer 102 determines whether there are any more properties that have not been considered (step 616). If there are more properties to consider, then the method loops back to step 592; otherwise, analyzer 102 generates a report or appends to an existing report. This report identifies the uncovered faults. In one embodiment of step 616, if all of the potential faults have already been covered (even though the system has not considered all of the properties), then there is no reason to loop back to step 592 and analyzer 102 will loop to step 612 instead. This optimization can apply to all three levels.

In one embodiment, step 592 can be optimized by propagating the constants for the properties, determining the size of the cone of logic for the properties by counting the number of gates in the cones, sorting the properties based on cone size and choosing the smallest property first.

In another embodiment, the third level of analysis can include sticking a signal in the design of a first value (e.g. logic one) and verifying the design with the signal stuck at the first value. If no properties fail, report the stuck-at fault as not being covered. If at least one property fails, stick the signal at a second value (e.g. logic zero) and verify the design. If no properties fail, report the fault as not being covered. If at least one property fails, then choose a different signal and repeat the process.

Step 606 of FIG. 6 includes verifying HD 104 using properties 106. There are various alternatives known in the art for verifying a design that are suitable for the method of FIG. 6. Some examples include model checking, language containment, satisfiability methods and symboling trajectory evaluation. Model checking, explicit or implicit, includes verifying that a design satisfies a given formula by checking that the reachable states of a system satisfy the property. The method used can be explicit (i.e. each state has a separate representation) or implicit (a group of states have the representation, generally as a boolean formula). Language containment (explicit or implicit) includes verifying that the design satisfies the requirements imposed by a finite state machine. Satisfiability methods include checking the validity of a formula against the design by checking that the conjunction of the design and negation of the formula is not satisfiable. The methods may be based on binary decision diagrams, branch-and-bound techniques or a combination of both. Symboling trajectory evaluation includes checking the correctness of a formula by building binary decision diagrams for intermediate nodes and checking that these binary decision diagrams satisfy the formula. The underlying method is symbolic simulation. A combination of the above verification methods can also be used.

Figure 7:
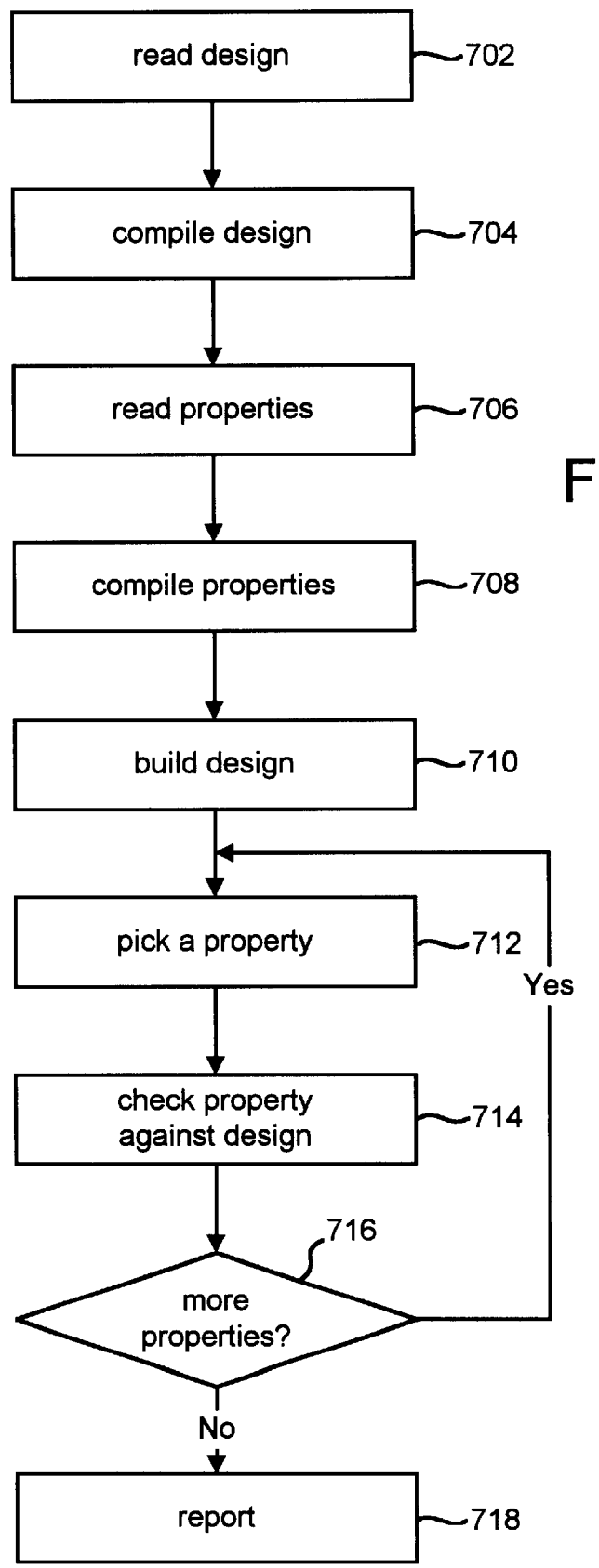
FIG. 7 is a flow chart describing one embodiment for performing the verification step of FIG. 6.

FIG. 7 is an example of one method of verifying a design. In step 702, the system reads the design. In step 704, the system compiles the design. In step 706, the system reads the properties. In step 708, the system compiles the properties. In step 710, the system builds the design. One embodiment for building a design includes building a gate-level representation of HD 104. Other embodiments include creating binary decision diagrams, branch and bound representations, a database of all reachable states of a design, an equation for every node in a design based on previous inputs over a bounded time frame or a combination of any of the above. Additionally, the system can also build a gate-level representation, a binary decision diagram, equation, etc. for the properties. In step 712, one of the properties is chosen by the system. In step 714, that property is checked against the design. In one embodiment, checking the property against the design includes determining whether a set of reachable states built in step 710 ever go into a defined bad state. To do this, the property has to be described as a finite state machine and the system had to have built a set of all reachable states. Alternatively, the property can be checked against any equations or gate level representation of the circuit or the negation of the property can be checked against the design or gate-level representation of the circuit. In one embodiment, one or more binary decision diagrams can be set up for the circuit and checked against the negation of the property. In step 716, the system determines whether there are any more properties to check. If there are, the method loops back to step 712. If there are no more properties to check, then the method loops to step 718 and the results of the verification are reported. When the method of FIG. 7 is used as part of the verify step of FIG. 6 (e.g. step 606), then one embodiment of step 718 (the report step) includes providing information back to the process of FIG. 6.

An example of the present invention will be described in regard to an 8-bit synchronous up/down counter with an input (ud) to instruct the counter to count either up (ud=one) or down (ud=zero). Other inputs include reset (rst), load (ld), the load value (cin) and enable (en). Since the counter is synchronous, reset and load take effect in the next clock cycle. The output of the counter is value of the count register cnt. The counter has the following characteristics:

Asserting the load input ld causes cnt to latch in the value of cin.

The value of cnt increments (or decrements) if the control-input ud is one (or zero) given that the enable signal en is one.

The Verilog source code for the counter is as follows:

```
module ud_counter (clk, ud, rst, ld, en, cin, cnt);
    input clk, ud, rst, ld, en;
    input [7:0] cin;
    output [7:0] cnt;
    reg [7:0] cnt, nxt_cnt;
    always @(cnt or ud) begin
       nxt_cnt[0]=!cnt[0];
       nxt_cnt[1]=(ud ? cnt[0]:!cnt[0])^cnt[1];
       nxt_cnt[2]=(ud ? & (cnt[1:0]):~|(cnt[1:0]))^cnt[2];
       nxt_cnt[3]=(ud ? & (cnt[2:0]):~|(cnt[2:0]))^cnt[3];
       nxt_cnt[4]=(ud ? & (cnt[3:0]):~|(cnt[3:0]))^cnt[4];
       nxt_cnt[5]=(ud ? & (cnt[4:0]):~|(cnt[4:0]))^cnt[5];
       nxt_cnt[6]=(ud ? & (cnt[5:0]):~|(cnt[5:0]))^cnt[6];
       nxt_cnt[7]=(ud ? & (cnt[6:0]):~|(cnt[6:0]))^cnt[7];
end
    always @ (posedge clk) begin
       if (rst) cnt<=8'b0;
       else if (ld) cnt<=cin;
       else if (en) cnt<=nxt_cnt;
end
    endmodule
```

To confirm correct operation of the counter, the following basic behaviors need to be verified: (1) values can be loaded into the counter by asserting the load input ld and (2) the counter correctly counts up and down.

The first property, values can be loaded into the counter by asserting the load input ld, can be written as follows: "!rst && ld=>'X(cnt)==cin." This property reads "If reset signal rst is zero and load signal ld is one this implies the value of cnt in the next clock cycle equals the input cin."

The second behavior, counting up and down, is described by the following properties:

define normal {!rst && !ld} ud && en && normal=>'X(cnt)==cnt+1;

!ud && en && normal=>'X(cnt)==cnt−1;

The left-hand side of both properties is almost identical except for the value of ud, which is either one or zero. The properties read: "if ud is one (zero) and enable signal en is one and normal is true, then in the next clock cycle the value of cnt will incremented (decremented) by one."

Running the static coverage analysis of FIGS. 1–7 using the above described properties and the up/down counter reveals that two signals are only partially covered by the property set. Neither of these signals has a property written for them under the following conditions:

en with the value of zero reset with the value of one

It is expected that when en is zero the count does not change. The following property states that "if normal is true and en is zero then cnt does not change." Note that this property is essential to the correct operation of the counter.

In other words, a counter which doesn't satisfy this property doesn't work properly as expected.

Figure 8:
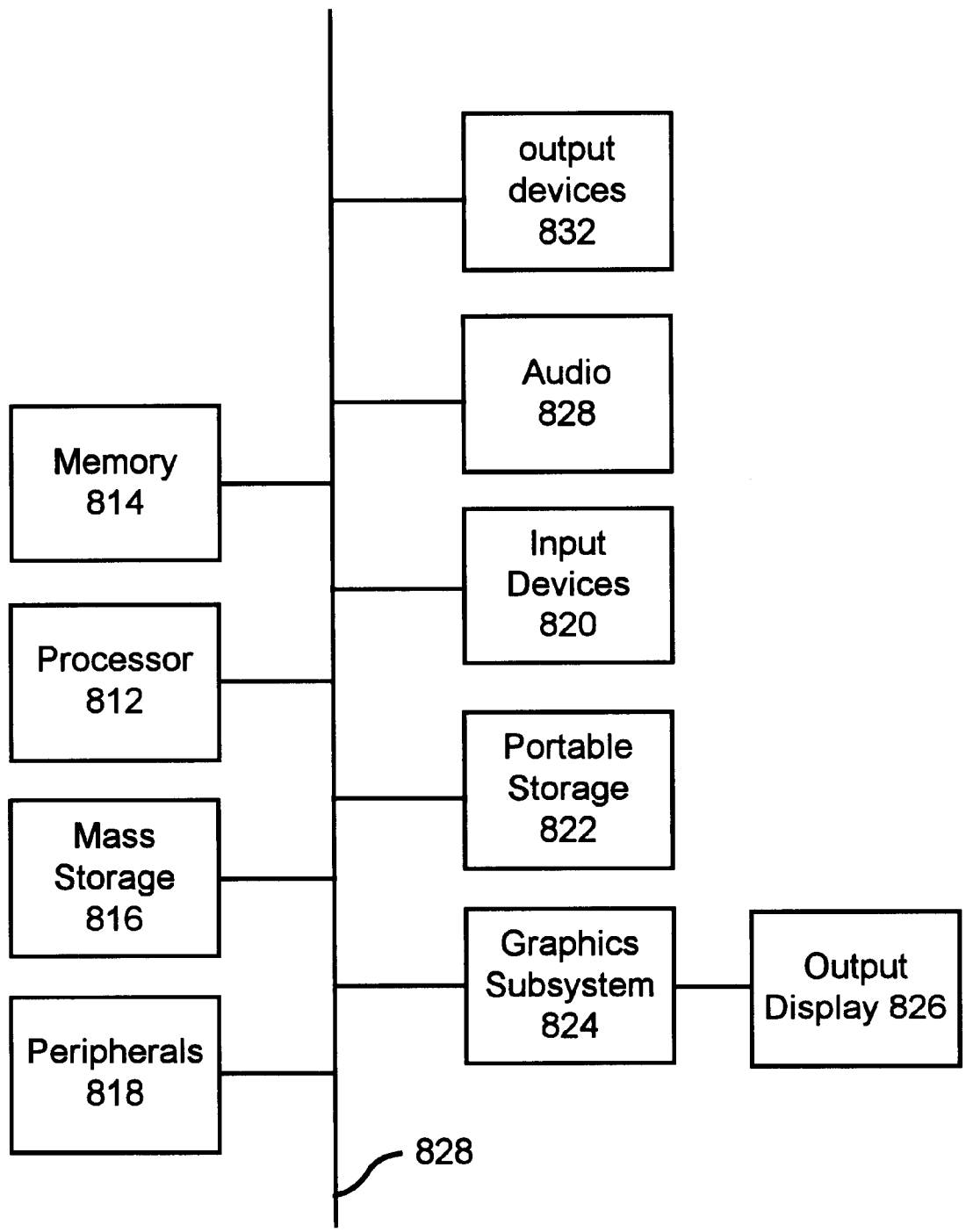
FIG. 8 is a block diagram of one exemplar hardware system for implementing the present invention.

(normal && !en)=>('X(cnt)==cnt),

When the synchronous reset is set to one then the value of cnt should change to zero in the next clock cycle. The following property proves this behavior:

rst=>('X(cnt)==0);

FIG. 8 illustrates a high level block diagram of a computer system which can be used to implement the present invention. The computer system of FIG. 8 includes a processor unit 812 and main memory 814. Processor unit 812 may contain a single microprocessor, or may contain a plurality of microprocessors for configuring the computer system as a multi-processor system. Main memory 814 stores, in part, instructions and data for execution by processor unit 812. If the system of the present invention is wholly or partially implemented in software, main memory 814 stores the executable code when in operation. Main memory 814 may include banks of dynamic random access memory (DRAM) as well as high speed cache memory.

The system of FIG. 8 further includes a mass storage device 816, peripheral device(s) 818, input device(s) 820, portable storage medium drive(s) 822, a graphics subsystem 824 and an output display 826. For purposes of simplicity, the components shown in FIG. 8 are depicted as being connected via a single bus 828. However, the components may be connected through one or more data transport means. For example, processor unit 812 and main memory 814 may be connected via a local microprocessor bus, and the mass storage device 816, peripheral device(s) 818, portable storage medium drive(s) 822, and graphics subsystem 824 may be connected via one or more input/output (I/O) buses. Mass storage device 816, which may be implemented with a magnetic disk drive or an optical disk drive, is a non-volatile storage device for storing data and instructions for use by processor unit 812. In one embodiment, mass storage device 816 stores the system software for implementing the present invention for purposes of loading to main memory 814.

Portable storage medium drive 822 operates in conjunction with a portable non-volatile storage medium, such as a floppy disk, to input and output data and code to and from the computer system of FIG. 8. In one embodiment, the system software for implementing the present invention is stored on such a portable medium, and is input to the computer system via the portable storage medium drive 822. Peripheral device(s) 818 may include any type of computer support device, such as an input/output (I/O) interface, to add additional functionality to the computer system. For example, peripheral device(s) 818 may include a network interface card for interfacing the computer system to a network, a modem, etc.

Input device(s) 820 provide a portion of a user interface. Input device(s) 820 may include an alpha-numeric keypad for inputting alpha-numeric and other key information, or a pointing device, such as a mouse, a trackball, stylus, or cursor direction keys. In order to display textual and graphical information, the computer system of FIG. 8 includes graphics subsystem 824 and output display 826. Output display 826 may include a cathode ray tube (CRT) display, liquid crystal display (LCD) or other suitable display device. Graphics subsystem 824 receives textual and graphical information, and processes the information for output to display 826. The system of FIG. 8 also includes an audio system 828. Additionally, the system of FIG. 8 includes output devices 832. Examples of suitable output devices include speakers, printers, etc.

The components contained in the computer system of FIG. 8 are those typically found in general purpose computer systems, and are intended to represent a broad category of such computer components that are well known in the art.

Thus, the computer system of FIG. 8 can be a personal computer, workstation, minicomputer, mainframe computer, etc. The computer can also include different bus configurations, networked platforms, multi-processor platforms, etc. Various operating systems can be used including Unix, Linux, Windows, MacIntosh OS, and other suitable operating systems.

The foregoing detailed description of the invention has been presented for purposes of illustration and description. It is not intended to be exhaustive or to limit the invention to the precise form disclosed, and obviously many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

I claim:

1. A method for determining verification coverage of a set of properties, the method comprising the steps of:

reading a set of properties;

reading at least a subset of a design; and determining what portions of said design can be verified by said set of properties without using test vectors.

2. A method according to claim 1, wherein said step of determining includes the steps of:

analyzing at least a first portion of said design;

identifying uncovered signals;

receiving one or more new properties; and analyzing said uncovered signals in light of said one or more new properties, said step of analyzing said uncovered signals does not analyze signals previously determined to be covered.

3. A method according to claim 1, wherein said step of determining includes the steps of:

analyzing at least a first portion of said design;

identifying uncovered signals;

receiving one or more new properties; and analyzing said uncovered signals in light of said one or more new properties, said step of analyzing said uncovered signals does not use said set of properties.

4. A method according to claim 1, wherein said step of determining includes the steps of:

performing a first level of analysis;

reporting said first level of analysis;

performing a second level of analysis;

reporting said second level of analysis;

performing a third level of analysis; and reporting said third level of analysis, said second level of analysis is more accurate than said first level of analysis, said third level of analysis is more accurate than said second level of analysis.

5. A method according to claim 1, wherein said step of determining includes the steps of:

performing a first level of analysis;

reporting said first level of analysis;

performing a second level of analysis;

reporting said second level of analysis;

performing a third level of analysis; and reporting said third level of analysis, said second level of analysis is slower than said first level of analysis, said third level of analysis is slower than said second level of analysis.

6. A method according to claim 1, wherein said step of determining includes only testing within cones of logic of said properties.

7. A method according to claim 1, further including the step of:

reporting one or more results based on said step of determining.

8. A method according to claim 1, wherein said step of determining includes the steps of:

choosing a property;

choosing one or more appropriate variables in said property;

determining fan-in for said one or more appropriate variables; and marking signals in said determined fan-in as being covered.

9. A method according to claim 8, wherein:

said step of determining what portions of said design can be verified includes reporting signals that are not marked.

10. A method according to claim 8, wherein said step of choosing one or more appropriate variables includes identifying variables in a given property that are not in a transitive fan-in of any other variable in said given property.

11. A method according to claim 1, wherein said step of determining includes the steps of:

propagating, in said design, constants for a given property;

removing constants from said property;

choosing one or more appropriate variables in said property;

determining fan-in for said one or more appropriate variables; and marking signals in said determined fan-in as being covered.

12. A method according to claim 11, wherein:

said step of determining what portions of said design can be verified includes reporting signals that are not marked.

13. A method according to claim 11, wherein said step of choosing one or more appropriate variables includes identifying variables in a given property that are not in a transitive fan-in of any other variable in said given property.

14. A method according to claim 11, wherein said step of determining what portions of said design can be verified further includes the step of:

marking signals affected by said step of propagating as being partially covered.

15. A method according to claim 1, wherein said step of determining includes the steps of:

sticking a first signal at a first value;

verifying said design using said set of properties and said first signal stuck at said first value; and if no properties fail, reporting said first signal.

16. A method according to claim 15, wherein said step of determining further includes the steps of:
   sticking said first signal at a second value;
   verifying said design using said set of properties and said first signal stuck at said second value; and
   if no properties fail, reporting said first signal.

17. A method according to claim 1, wherein said step of determining further includes the steps of:
   propagating, in said design, constants for a property;
   marking signals as being partially covered;
   removing constants from said property;
   determining a cone of logic for said property; and
   considering faults in said cone of logic.

18. A method according to claim 1, wherein said step of determining includes the steps of:
   propagating, in said design, constants for a property;
   determining a cone of logic for said property;
   choosing a signal and fault within said cone of logic;
   verifying said design with said fault; and
   if no properties fail, reporting said signal.

19. A processor readable storage medium having processor readable code embodied on said processor readable storage medium, said processor readable code for programming a processor to perform a method comprising the steps of:
   reading a set of properties;
   reading at least a subset of a design; and
   determining what portions of said design can be verified by said set of properties without using test vectors.

20. A processor readable storage medium according to claim 19, wherein said step of determining includes the steps of:
   analyzing at least a first portion of said design;
   identifying uncovered signals;
   receiving one or more new properties; and
   analyzing said uncovered signals in light of said one or more new properties.

21. A processor readable storage medium according to claim 19, wherein said step of determining includes the steps of:
   performing a first level of analysis;
   reporting said first level of analysis;
   performing a second level of analysis;
   reporting said second level of analysis;
   performing a third level of analysis; and
   reporting said third level of analysis, said second level of analysis is more accurate than said first level of analysis, said third level of analysis is more accurate than said second level of analysis.

22. A processor readable storage medium according to claim 19, wherein said step of determining includes the steps of:
   choosing a property;
   choosing one or more appropriate variables in said property;
   determining fan-in for said one or more appropriate variables; and
   marking signals in said determined fan-in as being covered.

23. A processor readable storage medium according to claim 19, wherein said step of determining includes the steps of:
   propagating, in said design, constants for a given property;
   removing constants from said property;
   choosing one or more appropriate variables in said property;
   determining fan-in for said one or more appropriate variables; and
   marking signals in said determined fan-in as being covered.

24. A processor readable storage medium according to claim 19, wherein said step of determining includes the steps of:
   determining a cone of logic for a property;
   choosing a signal and fault within said cone of logic;
   verifying said design with said fault; and
   if no properties fail, reporting said first signal.

25. An apparatus, comprising:
   an input device;
   an output device;
   a processor readable storage medium; and
   a processor in communication with said input device, said output device and said processor readable storage medium, said processor readable storage medium storing code to program said processor to perform the method comprising the steps of:
   reading a set of properties;
   reading at least a subset of a design; and
   determining what portions of said design can be verified by said set of properties without using test vectors.

26. An apparatus according to claim 25, wherein said step of determining includes the steps of:
   analyzing at least a first portion of said design;
   identifying uncovered signals;
   receiving one or more new properties; and
   analyzing said uncovered signals in light of said one or more new properties.

27. An apparatus according to claim 25, wherein said step of determining includes the steps of:
   performing a first level of analysis;
   reporting said first level of analysis;
   performing a second level of analysis;
   reporting said second level of analysis;
   performing a third level of analysis; and
   reporting said third level of analysis, said second level of analysis is more accurate than said first level of analysis, said third level of analysis is more accurate than said second level of analysis.

28. An apparatus according to claim 25, wherein said step of determining includes the steps of:
   choosing a property;
   choosing one or more appropriate variables in said property;
   determining fan-in for said one or more appropriate variables; and
   marking signals in said determined fan-in as being covered.

29. An apparatus according to claim 25, wherein said step of determining includes the steps of:

propagating, in said design, constants for a given property;

removing constants from said property;

choosing one or more appropriate variables in said property;

determining fan-in for said one or more appropriate variables; and marking signals in said determined fan-in as being covered.

30. An apparatus according to claim 25, wherein said step of determining includes the steps of:

choosing a signal and fault within said cone of logic;

verifying said design with said fault; and if no properties fail, reporting said first signal.

* * * * *